United States Patent [19]

Jung

[11] Patent Number: 5,621,684
[45] Date of Patent: Apr. 15, 1997

[54] NONVOLATILE SEMICONDUCTOR MEMBER WITH DIFFERENT PASS POTENTIAL APPLIED TO THE FIRST TWO ADJACENT WORD

[75] Inventor: Tae-Sung Jung, Kyungki-do, Rep. of Korea

[73] Assignee: Samsung Electronics Co., Ltd., Suwon, Rep. of Korea

[21] Appl. No.: 623,793

[22] Filed: Mar. 29, 1996

[30] Foreign Application Priority Data

Mar. 31, 1995 [KR] Rep. of Korea .................... 7532/1995

[51] Int. Cl.⁶ .................................................. G11C 16/06
[52] U.S. Cl. ................. 365/185.17; 365/185.23; 365/185.24
[58] Field of Search .................... 365/185.17, 185.23, 365/185.24

[56] References Cited

U.S. PATENT DOCUMENTS

5,402,373  3/1995  Aritome et al. ................. 365/185.17
5,511,022  4/1996  Yim et al. ......................... 365/185.17

*Primary Examiner*—David C. Nelms
*Assistant Examiner*—Micheal T. Tran
*Attorney, Agent, or Firm*—Cushman Darby & Cushman, IP Group of Pillsbury Madison & Sutro LLP

[57] ABSTRACT

A nonvolatile memory with NAND structured cells includes a plurality of cell units formed of a plurality of series-connected memory transistors, each having a source, a drain, a floating gate and a control gate. A row decoder is connected to the control gates of each memory transistor selects at east one of the cell units and one of the memory transistors within the selected cell unit. During programming, the row decoder causes a different pass potential to be applied to nonselected word lines adjacent to selected word lines than that which is applied to other nonselected word lines. Adjacent memory transistors respectively connected to the drain and source of the selected memory transistor on an unselected bit line are thus rendered nonconductive. Thereafter, the selected memory transistor is charged to a local boost potential when a programming potential is applied thereto, and a variation of its threshold voltage is prevented.

20 Claims, 8 Drawing Sheets

Fig. 1

(PRIOR ART)

(PRIOR ART)

NONVOLATILE SEMICONDUCTOR MEMBER WITH DIFFERENT PASS POTENTIAL APPLIED TO THE FIRST TWO ADJACENT WORD

BACKGROUND OF THE INVENTION

1. Field of the Invention

The present invention relates to nonvolatile semiconductor memories with NAND structured cells, and more particularly, to a method and apparatus for programming nonvolatile semiconductor memories with NAND structured cells.

2. Description of the Related Art

NAND structured cells have been developed for nonvolatile semiconductor memories, such as electrically erasable and programmable read only memories (EEPROMs), to reduce the on-chip area occupied by memory cells. The NAND structured cell (hereinafter, referred to as a "cell unit") typically includes a first selection transistor whose drain is connected to a corresponding bit line via a contact hole, a second selection transistor whose source is connected to a common source line and a plurality of memory transistors whose channels or drain-source paths are connected in series between the source of the first selection transistor and the drain of the second selection transistor. Such cell units are formed on a p-type well in a semiconductor substrate. Each memory transistor includes a floating gate formed on a gate tunnel oxide disposed over a channel region between the source and drain regions of the transistor and also includes a control gate formed on an intermediate insulating film disposed over the floating gate. Since such cell units reduce the number of selection transistors required per cell and the number of contact holes needed for ohmic contact with a bit line, EEPROMs using them may achieve a high density of memory capacity without increasing chip area.

A memory cell array for such an EEPROM is comprised of a multiplicity of cell units arranged in a matrix form of rows and columns. Gates of first selection transistors in a row of cell units are connected in common to a first selection line. Control gates of each series-connected memory transistor in the row are respectively connected to word lines. Gates of second selection transistors in the row are connected in common to a second selection line. The cell units in each row constitute a row block. Bit lines are connected to data latches providing a page buffer.

Before programming the memory transistors connected to a selected word line, all memory transistors within a row block associated with the selected word line, or the entire memory cell array, must be erased. Erasure is performed by applying an erase voltage of about 20 volts to the p-type well region, while applying 0 volts to the word lines of the row block or the memory cell array. Then, erased memory transistors are changed into depletion mode transistors with negative threshold voltages by extracting electrons from their floating gates by Fowler-Nordheim tunnelling. It is assumed that the erased memory transistors store data "1".

After the memory transistors are erased, programming is executed. To perform programming at high speeds, page programming is used, wherein data is written into all of the memory transistors connected to a selected word line at once. After loading data input via external data input terminals into the data latches respectively connected to the bit lines, page programming is used to write the data stored therein into all the memory transistors connected to the selected word line at one time.

Figure 1:
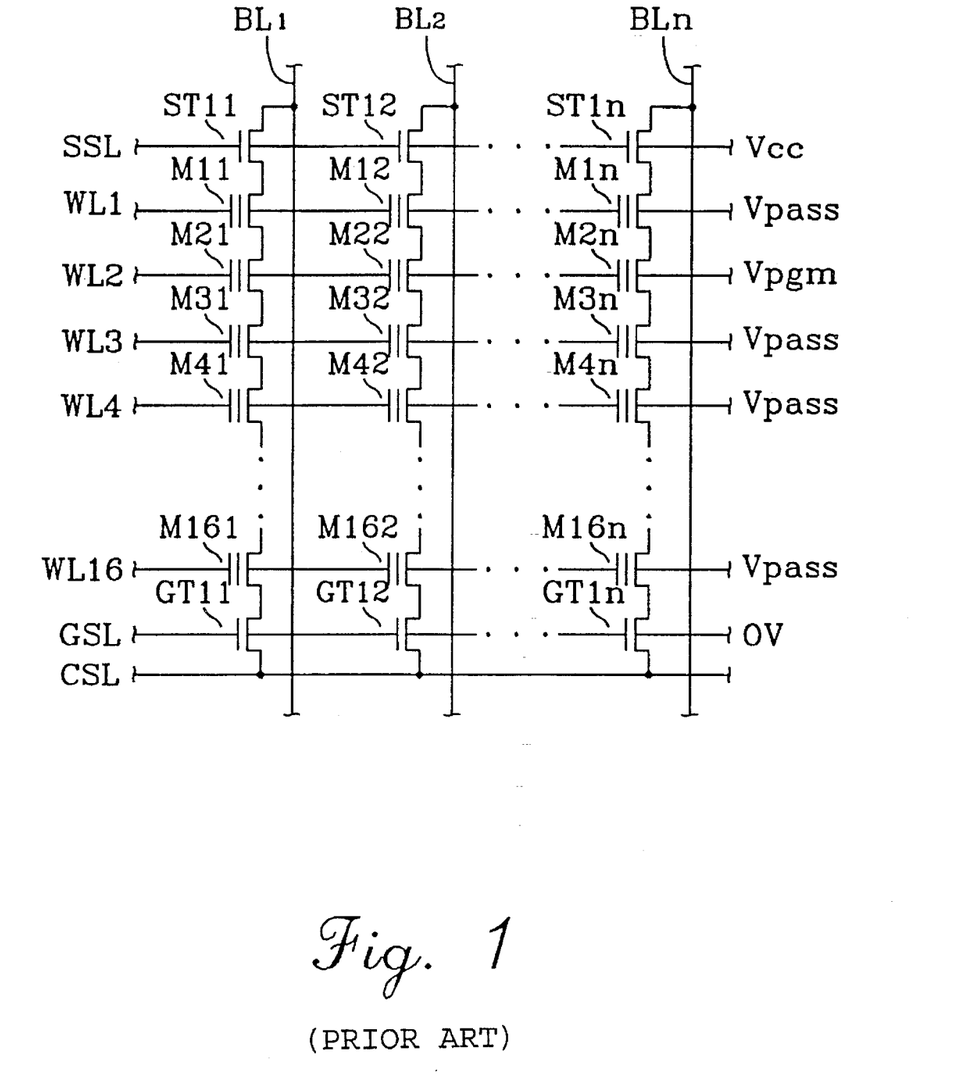
FIG. 1 is a schematic circuit diagram of a portion of a memory cell array illustrating a conventional page programming technique for a selected row block.

FIG. 1 is a circuit diagram for illustrating conventional page programming in connection with a row block.

Assume that programming is to be performed for memory transistors M21~M2n connected to a word line WL2. For simplicity of explanation, assume also that the selected memory transistors M21 and M2n are to be programmed to data "1" and data "0", respectively. Accordingly, the data latch connected to the bit line BL1 stores data "1" and the data latch connected to the bit line BLn stores data "0".

During programming, a bit line connected to a memory transistor which must maintain data "1", i.e. erased data, is defined as an "unselected" bit line, and a bit line connected to a memory transistor which must be changed into data "0" is defined as a "selected" bit line.

In the programming operation, the bit lines BL1 and BLn are respectively connected to data "1" (power supply potential Vcc) and data "0" (ground potential of 0 volts) Stored in the data latches associated therewith. The power supply potential Vcc is applied to the first selection line SSL. A pass potential Vpass, for example, 10 volts, is applied to unselected word lines WL1 and WL3~WL16, and a programming potential Vpgm, for example, 18 volts, is applied to the selected word line WL2. The ground potential of 0 volts is also applied to the second selection line GSL, thereby turning off the second selection transistors GT11~GT1n.

Then, the potential corresponding to data "0", i.e. the ground potential, is applied to the selected bit line BLn, and the power supply potential Vcc is applied to the gate of the first selection transistors ST1n, thereby causing the transistor ST1n to be turned on. The pass potential Vpass and the programming potential Vpgm are applied to the control gates of memory transistors M1n~M16n connected to the selected bit line BLn via the word lines as explained above. Therefore, the memory transistors M1n~M16n are all turned on, and their drains, sources and channels go generally to ground potential. At the same time, the programming potential Vpgm applied to the control gate of the memory transistor M2n connected to the selected word line WL2 causes the programming potential Vpgm to apply across its control gate and drain, source and channel, and thereby electrons tunnel into the floating gate of the memory transistor M2n. Consequently, the memory transistor M2n is changed into an enhancement mode transistor with a positive threshold voltage, i.e. it stores data "0".

On the other hand, the power supply potential Vcc, which corresponds to data "1", is applied to the unselected bit line BL1 from the data latch connected thereto in order for memory transistor M21 to maintain the erased data, i.e. data "1". Since the power supply potential Vcc is applied to the first selection lines SSL, the potential Vcc applies to the gate and drain of the first selection transistor ST11. Thereafter, the potential of control gates of memory transistors M11~M161 connected to the source of the first selection transistor ST11 increases from 0 volts to the pass potential Vpass and the programming potential Vpgm. Accordingly, the drains, sources and channels of the transistors M11~M161 are charged by capacitive coupling to a boost potential of Vbt. This potential is higher than the potential of Vcc-Vth, where Vth is a threshold voltage of the first selection transistor ST11, and may be expressed by the following equation:

$$V_{bt} = \frac{(n-1)rV_{pass} + rV_{pgm}}{n} + V_{cc} - V_{th}$$

where C1 is a capacitance between the control gate of each memory transistor and the source, drain and channel thereof, C2 is a capacitance between the channel, source and drain thereof and the p-type well, a coupling coefficient r is $$\frac{C1}{C1 + C2},$$

and n is the number of memory transistors within each cell unit.

Once the drains, sources and channels of memory transistors M11~M161 charge up to Vcc-Vth, the first selection transistor ST11 is turned off and then the drains, sources and channels of memory transistors M11~M161 uniformly charge to the boost potential Vbt. Therefore, the difference between the potential of the control gate and the potential of the drain, source and channel of the selected memory transistor M21 goes to Vpgm-Vbt. Because this potential difference is not high enough for F-N tunneling to occur, programming of the memory transistor M21 is inhibited. Therefore, the memory transistor M21 maintains the negative threshold voltage caused by its erasure. This self-program inhibition scheme is disclosed in U.S. Pat. No. 5,473,563 which is assigned to the assignee of the present invention, and which is incorporated herein by reference.

However, the self-program inhibition scheme as mentioned above has several problems. For example, when the pass potential Vpass is increased, the threshold voltages of nonselected memory transistors M1n and M3n~M16n within the cell unit associated with the programmed memory transistor M2n can increase due to the increased potential applied between control gates and drains, sources and channels of the nonselected memory transistors M1n and M3n~M16n. Therefore, it is desirable to lower the level of the pass potential Vpass. However, this lowers the value of Vbt, and hence increases the potential difference Vpgm-Vbt between the control gate and the drain, source and channel of the selected memory transistor M21. This in turn increases the threshold voltage of memory transistor M21 so that its ability to maintain erased data, i.e. data "1" is deteriorated. Therefore, an appropriate value for the pass potential Vpass must be determined such that the threshold voltages of both selected and nonselected memory transistors are not increased.

Figure 2:
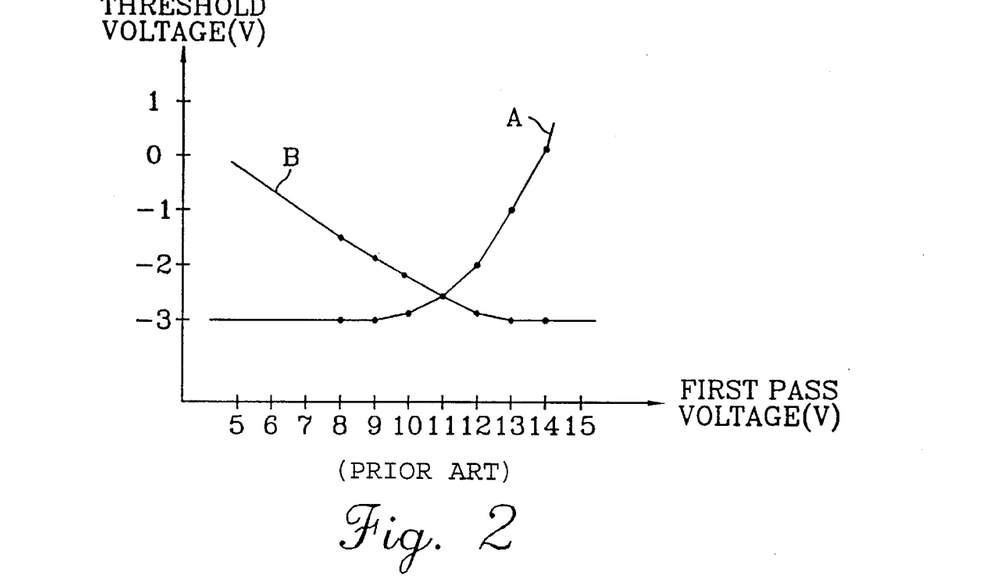
FIG. 2 is a graph showing the variations of threshold voltages of memory transistors connected to a selected word line when a pass potential increases in the selected row block shown in FIG. 1.

FIG. 2 is a diagram showing a variation of threshold voltages of nonselected memory transistors within cell units associated with selected bit lines (shown by curve A) and threshold voltage variations of selected memory transistors which are associated with nonselected bit lines, and which must maintain erased data when the pass potential Vpass is increased (shown by curve B). The curves of FIG. 2 represent measured values where the coupling coefficient r is about 0.6, and where a programming potential Vpgm of 18 volts is applied after erasure such that threshold voltages of programmed memory transistors go to -3 volts.

As can be seen in the drawing, the dependencies of the two curves A and B on the pass potential Vpass are inversely related to each other. Therefore, the allowed range of the pass potential Vpass can determined, in which its influence on both the threshold voltages represented by curve A and the threshold voltages represented by curve B is acceptable. For example, assume that read operations for erased memory transistors are possible even if their threshold voltages increase up to -2 volts. In this case, the acceptable range of the pass potential Vpass is 9.5 to 12 volts, as can be seen in FIG. 2.

However, since the threshold voltages of memory transistors still vary with any pass potential Vpass within the above-mentioned range, data stored in nonselected memory transistors within cell units associated with data "0" programmed memory transistors or in selected memory transistors which must maintain erased data can still be changed. Specifically, where one memory transistor connected to a selected word line is to be programmed to data "0", the programming operation for this memory transistor must be repeated if it does not have a desired threshold voltage, for example, a threshold voltage of 1 volt, after the completion of a program verifying operation. In fact, the programming operation is performed repeatedly until it has the desired threshold voltage. This makes it more likely that the threshold voltages of nonselected memory transistors within the cell unit associated therewith, or that the threshold voltages of selected memory transistors which are connected to the same word line but which have to maintain erased data, can be changed to the extent that their data is inverted.

Erasure is conventionally performed for each row block. Thereafter, memory transistors connected to selected word lines within the row block are programmed. However, even memory transistors connected to word lines which do not need to be programmed, must be reprogrammed after they are erased. The reason why programming is not performed by each word line is as follows. Programming is performed for memory transistors connected to a selected word line after they have been erased. After programming, reprogramming is performed when any one of those memory transistors does not have the desired threshold voltage. Therefore, the programming potential and pass potential may be applied to both selected word lines and nonselected word lines repeatedly. Therefore, as discussed above, the threshold voltages of memory transistors on the selected word line which must maintain erased data are likely to be changed, and erroneous data may occur.

Furthermore, when the memory transistors are multi-state memory cells which store information having more than two bits, the difference between threshold voltages of successive states is very small. For example, when each memory transistor is a four-state memory cell storing four-bit information, the memory cell must maintain threshold voltages of, for example, -2 volts and -1 volts, representing the two-state information between the most and least significant bits, and, for example, a threshold voltage of -3 volts for the least significant bit and a threshold voltage of 0 volt for the most significant bit. Accordingly, the difference between the threshold voltages of successive states is only 1 volt. Although threshold voltage variations caused by the programming potential Vpgm and the pass potential Vpass can theoretically be controlled to less than a 0.5 volts during normal operations, in practice they must be substantially controlled to less than about 0.1 volts in consideration of various factors, such as process variations, circumferential temperature and so on. Therefore, as can be seen in FIG. 2, since there is no range of the pass potential Vpass in which the variation of threshold voltages is equal to or less than 0.1 volts, memory transistors within each cell unit can not be used as multi-state memory cells.

SUMMARY OF THE INVENTION

An object of the present invention is, therefore, to provide an EEPROM capable of preventing threshold voltage variations for selected memory transistors within cell units which must maintain erased data during programming.

Another object of the present invention is to provide an EEPROM in which memory transistors within each cell unit can store stable, reliable multi-state data by preventing threshold voltage variations during programming.

Another object of the present invention is to provide an EEPROM capable of instantaneously erasing and programming by individual word lines such that variations of threshold voltages for memory transistors with erased data is substantially prevented during programming after the erasure of memory transistors connected thereto.

In order to achieve these and other objects, a nonvolatile memory with NAND structured cells according to the present invention includes a plurality of cell units formed of a plurality of series-connected memory transistors, each having a source, a drain, a floating gate and a control gate. A row decoder is connected to the control gates of each memory transistor selects at least one of the cell units and one of the memory transistors within the selected cell unit. During programming, the row decoder causes a different pass potential to be applied to nonselected word lines adjacent to selected word lines than that which is applied to other nonselected word lines. Adjacent memory transistors respectively connected to the drain and source of the selected memory transistor on an unselected bit line are thus rendered nonconductive. Thereafter, the selected memory transistor is charged to a local boost potential when a programming potential is applied thereto, and a variation of its threshold voltage is prevented.

BRIEF DESCRIPTION OF THE DRAWINGS

The present invention, along with the various features and advantages thereof, will be best understood by reference to the detailed description which follows, read in conjunction with the accompanying drawings, wherein.

DETAILED DESCRIPTION OF THE PREFERRED EMBODIMENTS

A memory cell array of the present invention is comprised of a plurality of cell units which are arranged in a matrix form of rows and columns. Each cell unit is comprised of a first selection transistor, sixteen memory transistors and a second selection transistor, all of whose source-drain paths are connected in series with one another. The drain of the first selection transistor in each cell unit is connected to a corresponding bit line. The source of the second selection transistor in each cell unit is connected to a common source line. A row of cell units constitutes a row block. Gates of first selection transistors in each row block are connected to a first selection line, while gates of second selection transistors in each row block are connected to a second selection line. Control gates of memory transistors arranged in sixteen rows in each row block are connected to sixteen word lines, respectively. Although sixteen rows of memory transistors in each row block are used in the embodiment of the present invention, it should be noted that the present invention is not limited to the number of memory transistors therein.

Figure 3:
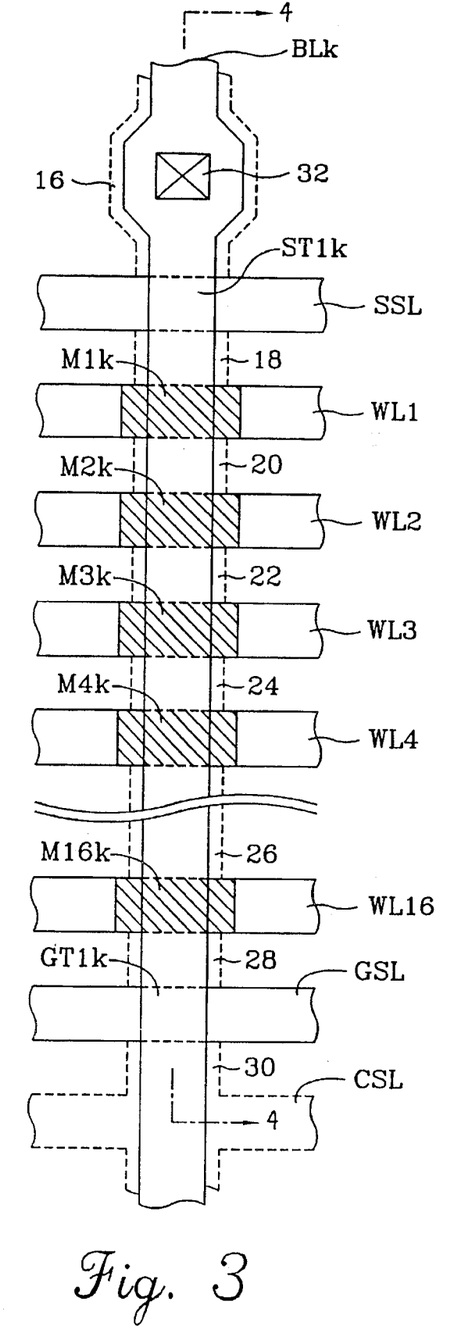
FIG. 3 is a plan view of a cell unit according to the present invention.
Figure 4:
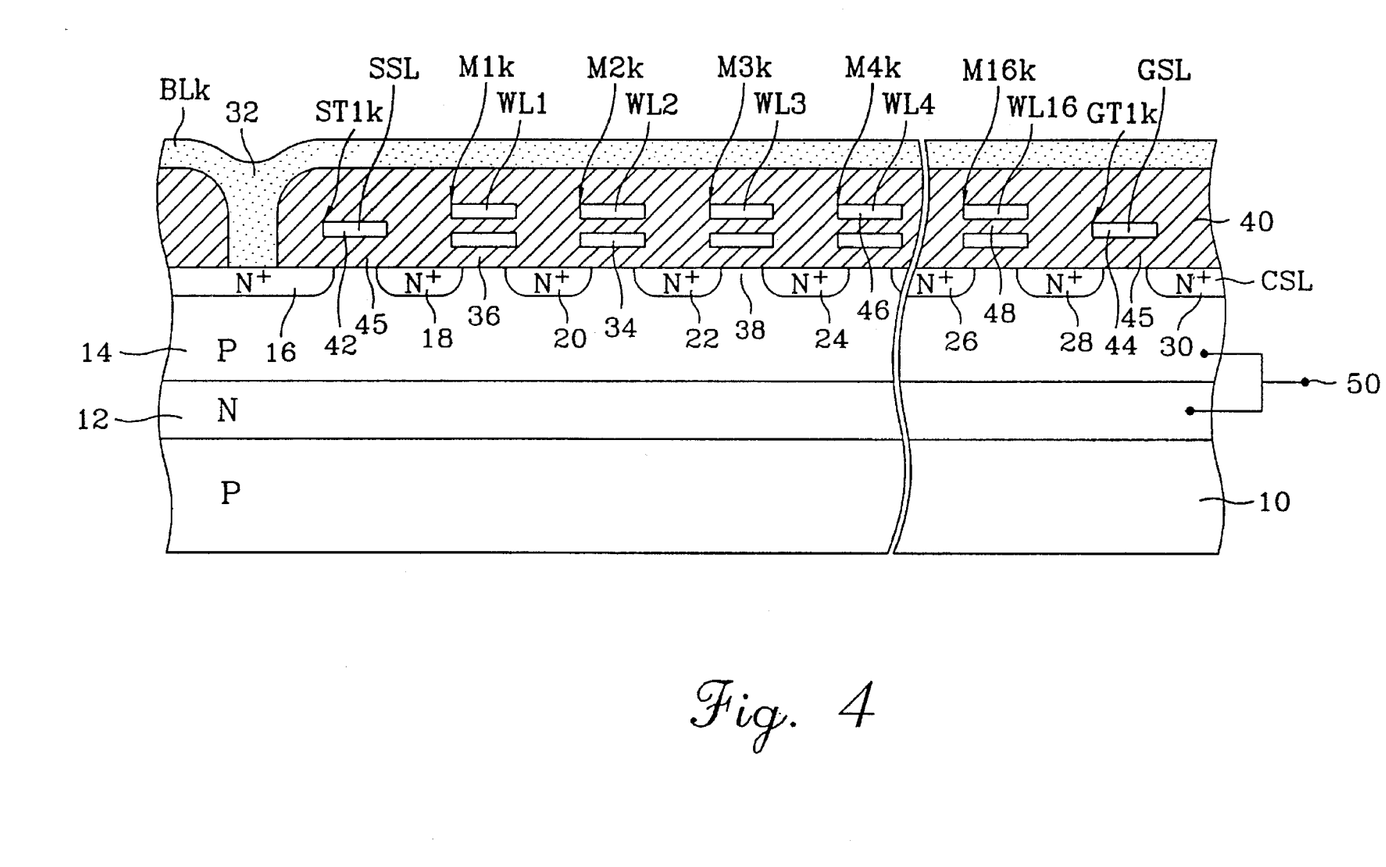
FIG. 4 is a cross sectional view taken along the line 4—4 of FIG. 3.

The memory cell array is formed in a p-type well region formed on a semiconductor substrate. FIGS. 3 and 4 illustrate plan and cross sectional views, respectively, of one of the cell units in the memory cell array.

As shown in FIGS. 3 and 4, the semiconductor substrate is of a p-type silicon monocrystalline material which is cut on the (1,0,0) crystal orientation at an impurity concentration of about $7\times10^{14}$ atoms/cm$^3$. A p-type well region 14 with an impurity of about $2\times10^{16}$ atoms/cm$^3$ is formed having a depth of about 4 μm from a main source of the substrate 10. The well region 14 is surrounded by an n-type well region 12 of about 10 μm in depth with an impurity concentration of about $5\times10^{15}$ atoms/cm$^3$. Heavily doped N$^+$ regions 16~30 are formed on the main surface of the well region 14 and separated by each of a plurality of channel regions 38. One part of the N$^+$ region 16 is a contact region connected via a contact hole 32 to a bit line BLk of a metal material, such as aluminum, which extends over an insulating layer 40, and the other part of the N$^+$ region 16 serves as a drain region of the first selection transistor ST1k. N$^+$ regions 18~28 serve as common source-drain regions of two adjacent ones of transistors ST1k, M1k~M16k and GT1k. One part of N$^+$ region 30 is a source region of the second selection transistor GT1k, and the other part of N$^+$ region 30 serves as a buried common source line CSL. However, the line CSL may be a conductor layer which is insulatively formed within the insulating layer 40 contracting with the N$^+$ source region 30 of the transistor GT1k via a contact hole. Gate layers 42 and 44 of a refractory metal silicide material such as tungsten silicide, each having a thickness of about 1,500 Å, are respectively formed on gate insulating layers 45 of about 300 Å thickness, overlying channel regions of the first and second selection transistors ST1k and GT1k.

Floating gate layers 34 of a polycrystalline silicon metal are insulatively formed with a thickness of about 1,500 Å on gate insulating layers 36 of about 100 Å thickness overlying channel regions 38 of memory transistors M1k~M16k, respectively. Control gates 46 of the same material and thickness as the gate layers 42 and 44 are respectively formed over the floating gate layers 34, interposing intermediate insulating layers 48, such as ONO insulating layers of silicon dioxide—silicon nitride—silicon dioxide materials, of about 250 Å thickness. The gate layers 42 and 44 and the control gate layers 46 are respectively shared by the first and second selection lines SSL and GSL and word lines WL1~WL16, i.e. conductor layers which are fabricated from the same material as the gate and control gate layers 42, 44 and 46. The gate layers 42 and 44, control gate layers 46, floating gate layers 34, first and second selection lines SSL and GSL, and word lines WL1~WL16 are insulated from one another with an insulating layer 40 of insulating materials, such as a silicon dioxide and a BPSG or a PSG.

Bit line BLk is connected with the $N^+$ region 16 via contact hole 32 and extends in a column direction on the insulating layer 40. The p-type well region 14 and the n-type well region 12 are connected to a well electrode 50 in common via contact holes (not shown). The memory cell array of the present invention may also be formed on a p-type well region formed in an n-type monocrystalline silicon substrate.

Figure 5:
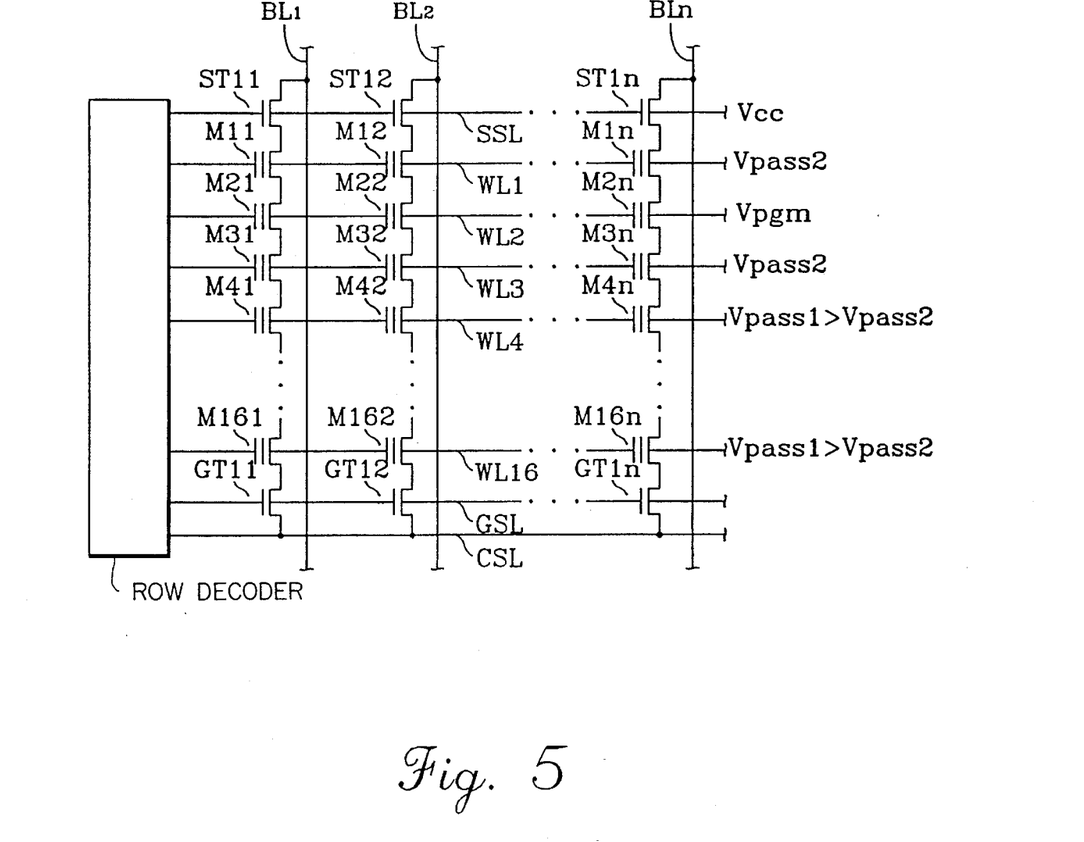
FIG. 5 is a schematic circuit diagram of a portion of a memory cell array for illustrating a page programming technique for a selected row block according to the present invention.

FIG. 5 is a schematic circuit diagram for illustrating a scheme for programming a selected row block according to the preferred embodiment of the present invention. For the convenience of illustration, it should be noted that only one of a plurality of row blocks is shown.

In FIG. 5, memory transistors M21~M2n are connected to a selected word line WL2 in a selected row block. As compared with the scheme of FIG. 1, the present invention has a characteristic feature that the programming potential Vpgm is applied to the selected word line WL2 after a second pass potential Vpass2, lower than a first pass potential Vpass1, is applied to word lines WL1 and WL3 adjacent to the selected word line WL2 during programming. Meanwhile, the first pass potential Vpass1 is applied to word lines WL4~WL16. The application of these potentials causes first and second memory transistors, adjacent to the selected memory transistors which have to maintain erased data, to be turned off. Thereby, the sources, drains and channels of the selected memory transistors are charged by means of capacitive coupling, which substantially prevents a variation of their threshold voltages.

Assume now that a word line WL2 is selected and a selected memory transistor M21 must maintain erased data, i.e. data "1", during the programming operation. Meanwhile, the remaining memory transistors M22~M2n in the cell unit must be changed into data different from the erased data, for example, data "0". Accordingly, the data latch (not shown) connected to the bit line BL1 loads data "1" while data latches respectively connected to bit lines BL2~BLn load data "0". Such a data loading technique prior to programming is disclosed in U.S. Pat. No. 5,473,563. The data latch connected to unselected bit line BL1 provides power supply potential Vcc corresponding to data "1" on the nonselected bit line BL1, and data latches connected to selected bit lines BL2~BLn provide ground potential corresponding to data "0" on the bit lines BL2~BLn. At the same time, a potential going to the power supply potential Vcc is provided from the row decoder 52 on the first selection line SSL in the selected row block at time t0 of FIG. 6.

Figure 6:
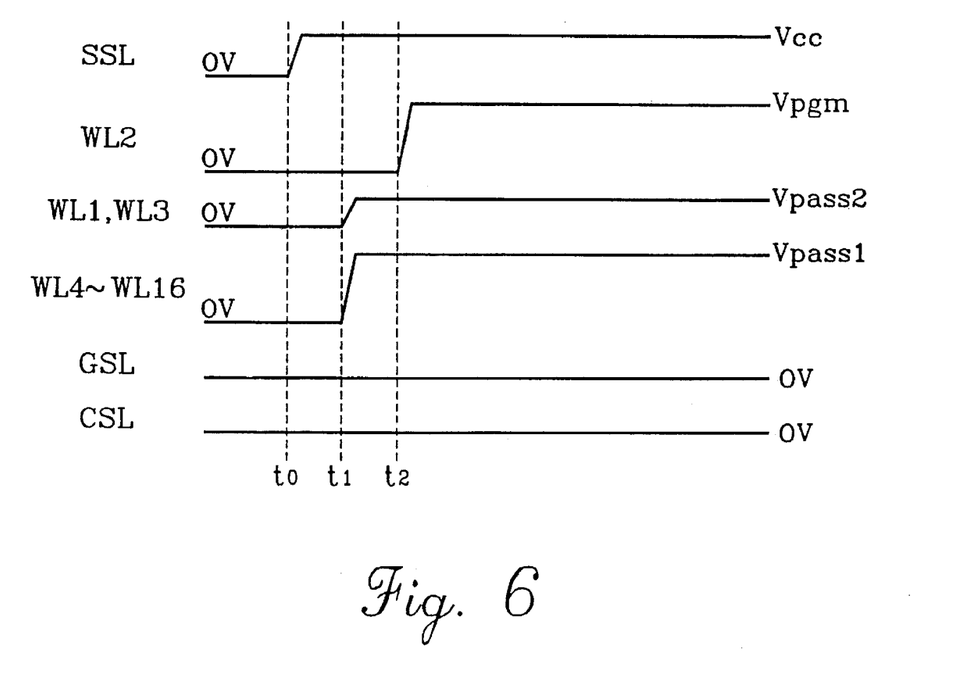
FIG. 6 is a timing diagram for programming a selected row block according to one embodiment of the present invention.

Thereafter, at time t1, nonselected word lines WL1 and WL3 adjacent to the selected word line WL2 go to the second pass potential Vpass2, while nonselected word lines WL4~WL16 go to the first pass potential Vpass1 higher than the second pass potential Vpass2. The first pass potential Vpass1 is sufficiently high enough such that the threshold voltages of nonselected memory transistors, connected to selected memory transistors which are changed into data "0", are not generally varied. The first pass potential Vpass1 is also sufficiently high enough such that the ground potential to data "0" programmed memory transistors can be transmitted therethrough, even when unselected memory transistors to which the potential Vpass1 is applied have been previously programmed to data "0", i.e. positive threshold voltages. Therefore, the application of the first and second pass potentials Vpass1 and Vpass2 causes the drains, sources and channels of memory transistors, which are connected to selected bit lines BL2~BLn in the selected row block, to go to the ground potential.

On the other hand, the source of first selection transistor ST11 connected to the nonselected bit line BL1 goes to Vcc-Vth before time t1 and after the application of Vcc to the first selection line SSL, where Vth is a threshold voltage of the first selection transistor ST11. If memory transistors M11 and M31 are memory cells programmed to data "0", i.e. positive threshold voltages $Vth^+$, the memory transistor M11 is in a nonconductive state prior to time t1. Therefore, the drains, sources and channels of memory transistors M21~M161 are in ground states. If Vpass1 is less than Vcc-Vth, the drain, source and channel of the selected memory transistor M21 are charged to $Vpass2-Vth^+$ by the application of Vpass2 after time t1. The drain of memory transistor M41 is also charged to rVpass1 by means of capacitive coupling by the application of Vpass1. Since Vpass2-rVpass1 is less than $Vth^+$, the memory transistor M31 is also in a nonconductive state. After time t2, the potential of the drain, source and channel of the selected memory transistor M21 is boosted to $rVpgm+Vpass2-Vth^+$ by the application of the programming potential Vpgm to the word line WL2. The local boost potential causes the selected memory transistor M21 and its adjacent first and second memory transistors M11 and M31 to be turned off. Therefore, a variation of the threshold voltage of transistor M21 is prevented by charging the local boosted potential to the drain, source and channel thereof.

On the other hand, if first and second memory transistors M11 and M31 have erased data "1", i.e. negative threshold voltages, the drain, source and channel of the selected memory transistor M21 are charged to a potential higher than Vcc-Vth between t1 and t2. Therefore, after time t2, the drain, source and channel of the selected memory transistor M21 are locally charged to a potential of rVpgm+Vcc-Vth or more by the application of Vpgm to its control gate, and thereby the first and second memory transistors M11 and M31 are turned off. Therefore, the threshold voltage of the selected memory transistor M21 is not varied by the charged local boost potential. The higher the local boost potential charged to the drain, source and channel of the selected memory transistor M21, the better the variation of threshold voltage of the transistor M21 can be prevented. That is, since the local boost potential, i.e., $rVpgm+Vpass1-Vth^+$, is higher than the conventional charging potential, a variation of the threshold voltage of selected memory transistor M21 can be sufficiently prevented.

A potential lower than Vpass2, for example, a ground potential, may be applied to the word line WL3 which is near to the common source line CSL of two nonselected word lines WL1 and WL3 adjacent the selected word line WL2. If memory transistors M31~M3n have been programmed to data "0", these memory transistors M31~M3n are turned off by the application of the ground potential to their control gates. Therefore, the drain, source and channel of the memory transistor M21 are charged to the above-mentioned local boost potential, and thereby the threshold voltage variation thereof can be avoided. Drains, sources and channels of memory transistors M22~M2n go to ground states, as mentioned above, and the application of the programming potential Vpgm to control gates of the transistors M22~M2n changes their threshold voltages into a positive threshold voltage, i.e. data "0". On the other hand, since the drains, sources and channels of memory transistors connected to word lines WL4~WL16 are charged to the potential of rVpass1, there is no variation of their threshold voltages.

Figure 7:
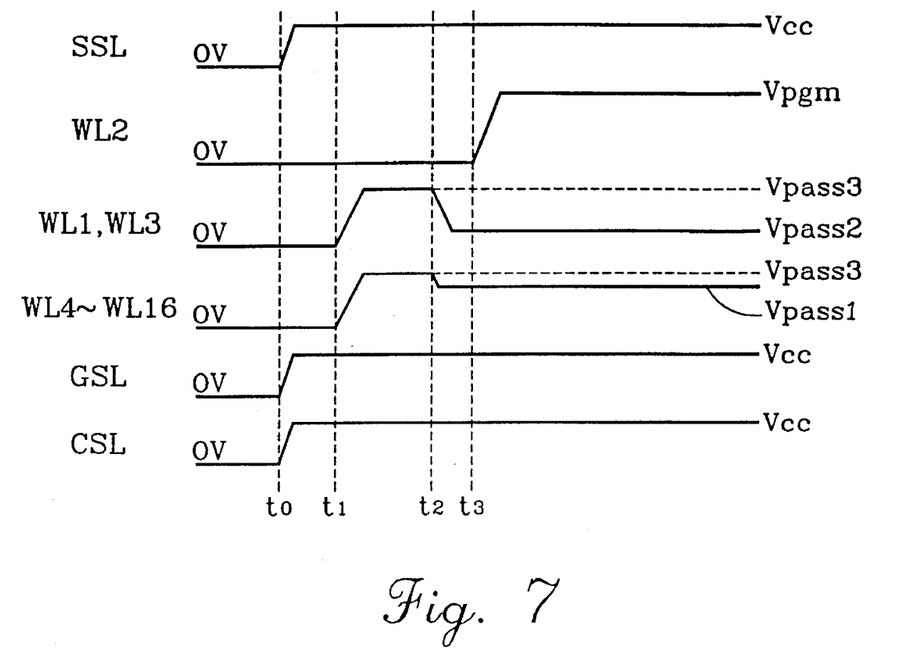
FIG. 7 is a timing diagram for programming a selected row block according to another embodiment of the present invention.

FIG. 7 is a timing diagram of another embodiment for programming memory transistors connected to a selected word line WL2. As explained in connection with FIG. 6, when memory transistors M11 and M31 have been programmed to data "0", the drain, source and channel of the selected memory transistor M21 are charged to a potential less than Vcc-Vth prior to time t1. Between t1 and t2 of FIG. 7, a boost potential of Vpass3 higher than Vpass1 is applied to word lines WL4~WL16 for a predetermined time, for example, approximately 45~100 nsec, which causes the drain, source and channel of the selected memory transistor M21 to be charged to Vcc-Vth. Therefore, when the programming potential Vpgm is applied to the selected word line WL2, the drain, source and channel of the selected memory transistor M21 can then be charged to a potential higher than the local boost potential as discussed in connection with FIG. 6.

Figure 8:
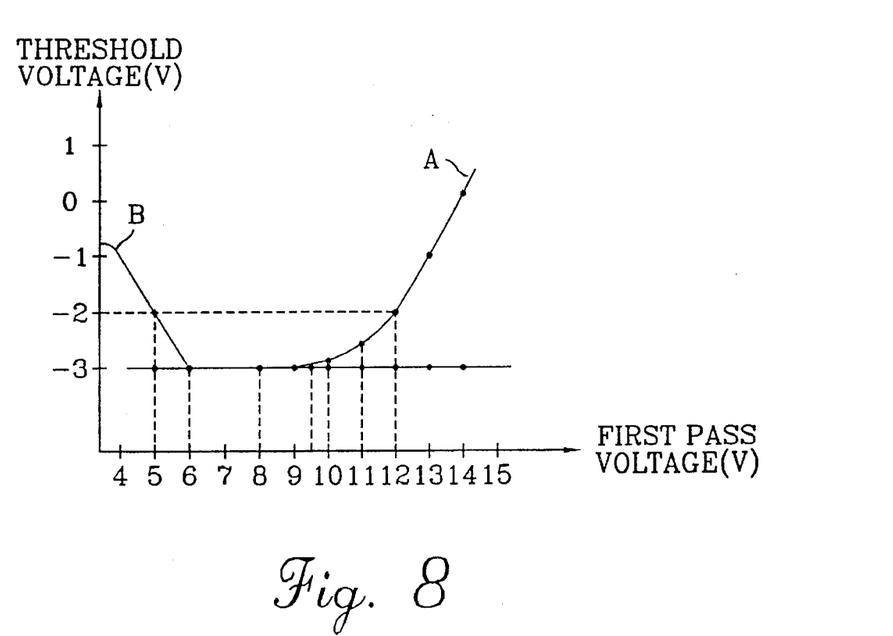
FIG. 8 is a graph showing the variation of threshold voltages of memory transistors when a first programming potential increases according to the present invention.

FIG. 8 is a graph showing a variation of threshold voltages according to the increase of first pass potential Vpass1 where a second pass potential Vpass2 of about 2 volts, a programming potential Vpgm of about 18 volts and a coupling coefficient r of about 0.6 are used according to the present invention. The curve A represents threshold voltage variations of nonselected memory transistors connected to selected bit lines, while the curve B represents those of selected memory transistors connected to nonselected bit lines. As can be seen in FIG. 8, there is no threshold voltage variation for selected and nonselected memory transistors when programming is performed after erasure of the memory transistors to threshold voltages of about -3 volts, and the first pass potential Vpass1 is in the range of about 6.0 to 9.5 volts. Therefore, if the first pass potential Vpass1 has a potential level within this range, multi-bit storage for each memory transistor in each cell unit is possible. Page erasing and programming can be accomplished because the absence of variations of the threshold voltages of the memory transistors ensures a sufficient operation margin between successive multi-bit states.

Figure 9A:
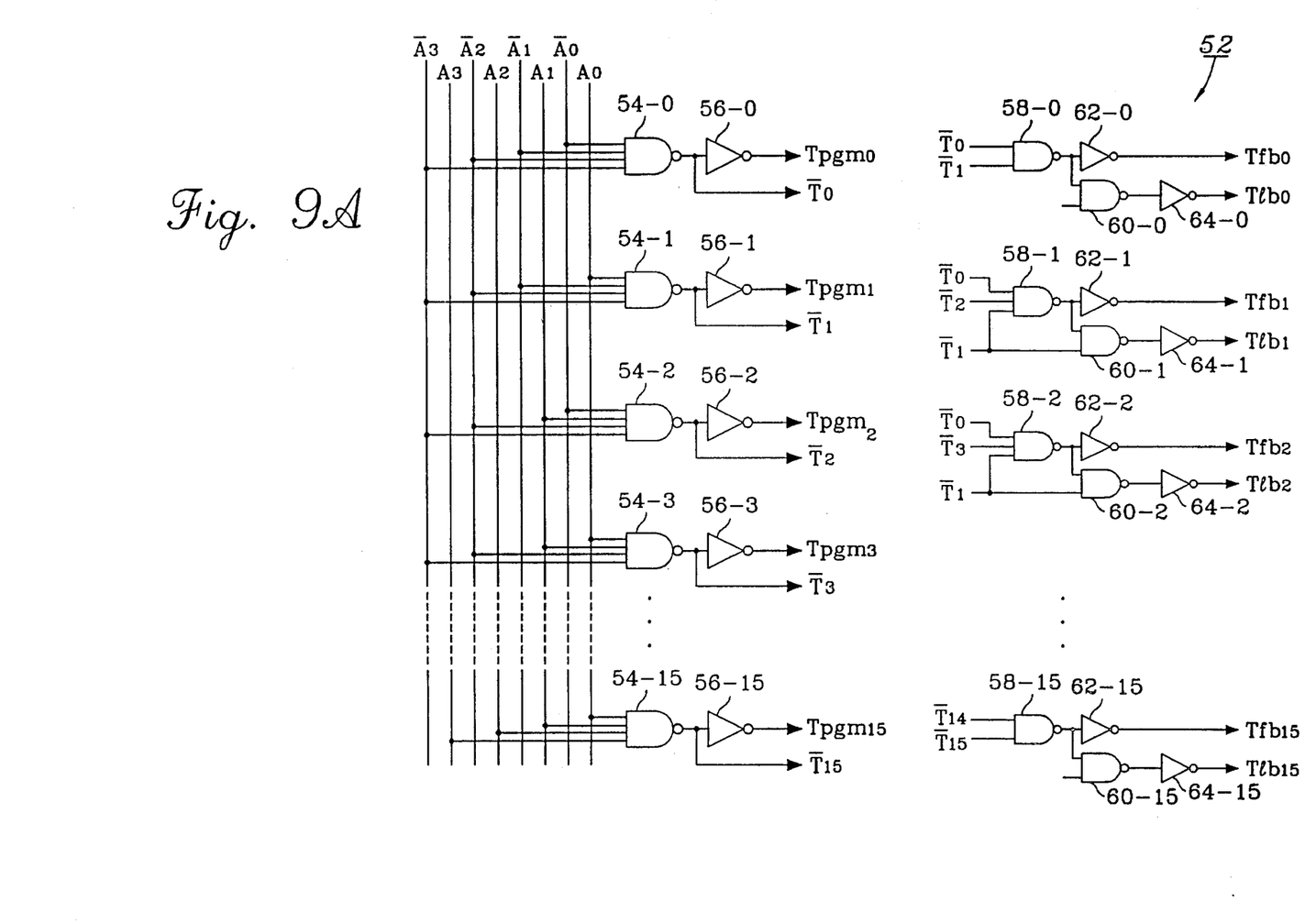
FIGS. 9A and 9B are a schematic circuit diagram of a row decoder according to the present invention.
Figure 9B:
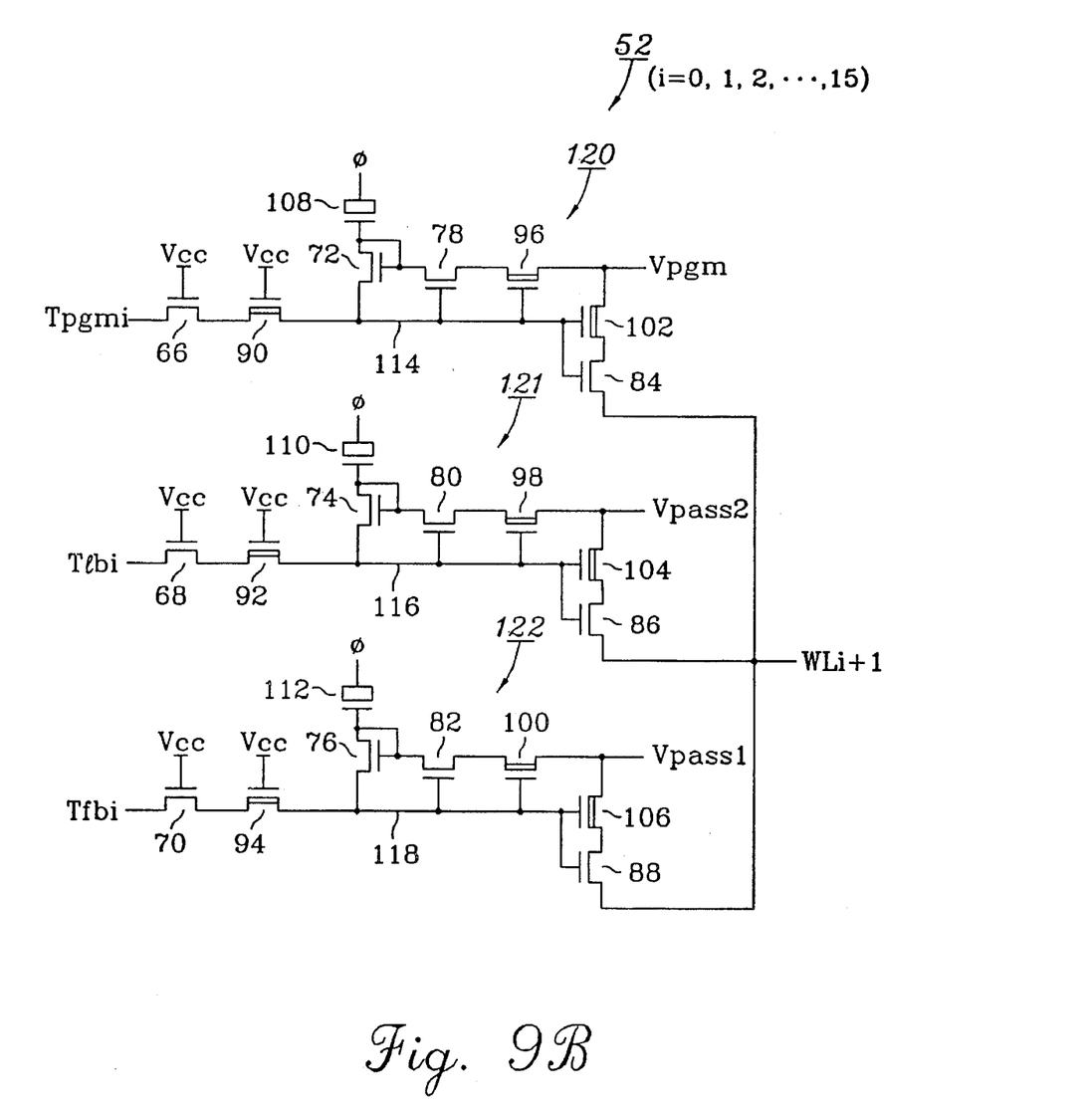

FIGS. 9A and 9B are schematic circuit diagrams of an exemplary embodiment of a row decoder which is used in the present invention. FIG. 9A represents one portion of the row decoder, and FIG. 9B the other portion thereof. As shown in FIG. 9A, the row decoder includes NAND gates 54-0 to 54-15, 58-0 to 58-15 and 60-0 to 60-15, and inverters 56-0 to 56-15, 62-0 to 62-15 and 64-0 to 64-15. NAND gates 54-0 to 54-15 receive the combination of address signals A0~A3 and their complement signals $\overline{A0}$~$\overline{A3}$ to select one of 16 word lines in a selected row block. Inverters 56-0 to 56-15 are respectively connected to the outputs of NAND gates 54-0 to 54-15 to produce program decoding signals Tpgm0~Tpgm15 for selecting one of the 16 word lines.

Circuit portions comprised of NAND gates 58-0 to 58-15 and 60-0 to 60-15 and inverters 62-0 to 62-15 and 64-0 to 64-15 respectively produce first and second decoding signals Tfb0~Tfb15 and Tlb0~Tlb15 to generate first and second pass potentials in response to the combination of the output signals $\overline{T}_0$~$\overline{T}_{15}$ from the NAND gates 54-0 to 54-15. For example, if a word line WL4 is to be selected, program decoding signal Tpgm3, first decoding signals Tlb2 and Tlb4 and second decoding signals Tfb0, Tfb1 and Tfb5 to Tfb15 go to "H" levels (power supply voltages Vcc), while the remaining signals Tpgm0 to Tpgm2, Tpgm4 to Tpgm15, Tlb0, Tlb1, Tlb3, Tlb5 to Tlb15 and Tfb2 to Tfb4 stay at "L" levels (ground voltages).

In FIG. 9B there are shown circuit portions for producing signals which drive word lines WL1~WL16 in response to program decoding signals Tpgm0~Tpgm15 and first and second decoding signals Tlb0~Tlb15 and Tfb0~Tfb15. The circuit portions of FIG. 9B include enhancement mode n-channel MOS transistors 66~88, depletion mode n-channel MOS transistors 90~106 and MOS capacitors 108~112. Transistors 90~106 serve to prevent insulation destructions of transistors 66~70, 78~82 and 84~88 due to the transmission of high voltages.

A circuit portion 120 including MOS capacitor 108 and transistors 72, 78 and 96 is a conventional high voltage generator for providing a high voltage higher than the programming potential Vpgm on line 114 in response to a clock signal $\phi$ from a ring oscillator (not shown) when the line 114 is placed at "H" level, and for transferring the programming potential Vpgm onto the word line WLi+1 via transistors 102 and 84. Similarly, a circuit portion 121 including MOS capacitor 110 and transistors 74, 80 and 98 is a high voltage generator for transferring the second pass potential Vpass2 onto the word line WLi+1, and a circuit portion 122 including MOS capacitor 112 and transistors 76, 82 and 100 is a high voltage generator for transferring the first pass potential Vpass1 onto the word line WLi+1. The high voltage generator 121 transfers the second pass potential Vpass2 onto the word line WLi+1 when Tlbi signal is at "H" level. Similarly, the high voltage generator 122 transfers the first pass potential Vpass1 onto the word line WLi+1 when Tfbi signal is at "H" level.

The row decoder as shown in FIGS. 9A and 9B causes signals Tpgm3, Tlb2, Tlb4, Tfb0, Tfb1 and Tfb5 to Tfb15 to go to "H" levels with the selection of word line WL4 as discussed above, thereby providing the first pass potential Vpass1 on word lines WL1, WL2 and WL5 to WL15, the second pass potential Vpass2 on word lines WL3 and WL5 and the programming potential Vpgm on the selected word line WL4.

A row block selection circuit for selecting one of a plurality of row blocks and a common source line driving circuit is disclosed in U.S. Pat. No. 5,473,563.

Although the programming potential is applied after the application of first and second pass potentials in the present invention, the programming potential may be applied at the same time as the application of the first and second pass potentials. Although the power supply voltage is also applied to nonselected bit lines and gates of first selection transistors in a selected row block in the embodiment of the present invention, it should be noted that the present invention is not limited to that particular arrangement. A first potential such as the first pass potential or an intermediate potential lower than the first pass potential may also be applied to the nonselected bit lines and the gates of the first selection transistors therein.

As explained above, since threshold voltages of memory transistors which have to maintain erased data do not vary for a wide range of values of the first pass potential Vpass1, page erasing and programming modes of operation are possible and data retention reliability is also enhanced. Since the second pass potential Vpass2 with a low potential value may be used, the first pass potential Vpass1 can be lowered, thereby decreasing power consumption.

Although the present invention has been described in detail with reference to the preferred embodiments thereof, those skilled in the art will readily appreciate that various substitutions and modifications can be made thereto without departing from the spirit and scope of the invention as set forth in the appended claims.

What is claimed is:

1. A nonvolatile semiconductor memory comprising:
a plurality of cell units each having a plurality of series-connected memory transistors, each of said memory transistors having a source, a drain, a floating gate and a control gate; and
a decoder coupled to said control gates of said memory transistors, said decoder selecting at least one of said cell units and one of said memory transistors within said selected cell unit for programming said cell unit with data corresponding to erased data, said decoder providing a programming potential to said control gate of said selected memory transistor and rendering non-conductive first and second adjacent memory transistors respectively coupled to said drain and said source of said selected memory transistor, said drain and said source of said selected memory transistor being charged to a local boost potential so that said selected memory transistor maintains a threshold voltage corresponding to said erased data.

2. A nonvolatile semiconductor memory as recited in claim 1, wherein said decoder provides a first pass potential lower than said programming potential to said control gates of unselected memory transistors other than said first and second adjacent memory transistors and said selected memory transistor in said selected cell unit, and provides a second pass potential lower than said first pass potential to said control gates of said first and second memory transistors.

3. A nonvolatile semiconductor memory as recited in claim 2, wherein said decoder delays providing said programming potential at least until providing said first and second pass potentials.

4. A nonvolatile semiconductor memory as recited in claim 3, wherein said second pass potential has a potential value higher than a threshold voltage corresponding to programming data different from said erased data.

5. A nonvolatile semiconductor memory as recited in claim 3, wherein said first and second pass potentials have a boosted potential value for a predetermined time duration.

6. A nonvolatile semiconductor memory as recited in claim 1, further comprising a plurality of bit lines, and wherein each of said cell units further includes:
a selection transistor coupled between one end of said cell unit and a corresponding one of said bit lines, said first adjacent memory transistor being coupled between said selected memory transistor and said selection transistors said second adjacent memory transistor being coupled between said selected memory transistor and an end opposite said one end of said cell unit, said decoder providing a first pass potential lower than said programming potential to said control gates of memory transistors between said first adjacent memory transistor and said one end, providing a second pass potential lower than said first pass potential to said control gate of said first adjacent memory transistor, providing a potential lower than said second pass potential to said control gate of said second adjacent memory transistor, and providing a first potential to a gate of said selection transistor and said corresponding one of said bit lines.

7. A nonvolatile semiconductor memory as recited in claim 6, wherein said first potential is a power supply potential.

8. A nonvolatile semiconductor memory as recited in claim 6, further comprising a plurality of data latches respectively connected to said bit lines.

9. A nonvolatile semiconductor memory as recited in claim 6, wherein said decoder delays providing said second pass potential and said potential lower than said second pass potential until after providing said first pass potential, and delays providing said programming potential at least until it is providing said second pass potential and said potential lower than said second pass potential.

10. A nonvolatile semiconductor memory comprising:
a multiplicity of cell units arranged in a matrix of rows and columns, a row of cell units defining a row block, each cell unit including a plurality of series-connected memory transistors, each of said memory transistors having a drain, a source, a floating gate and a control gate;
a plurality of word lines coupled to said control gates of memory transistors within respective ones of said row blocks; and
a decoder coupled to said word lines, said decoder selecting one of said word lines within a selected one of said row blocks for programming memory transistors coupled thereto, said decoder providing a first pass potential to remaining word lines within said selected row block other than said selected word line and adjacent ones of said word lines thereto, providing a second pass potential lower than said first pass potential to said adjacent ones of said word lines, and providing a programming potential higher than said first pass potential to said selected word line.

11. A nonvolatile memory according to claim 10, wherein said decoder provides said potentials such that drains and sources of a first group of said memory transistors coupled to said selected word line are charged to a predetermined potential by said second pass potential and then charged to a higher potential above said predetermined potential by said programming potential such that threshold voltages of said first group of memory transistors are not substantially changed so as to maintain erased data, said decoder providing said potentials such that drains and sources of a second group of said memory transistors coupled to said selected word line are discharged to a ground potential such that threshold voltages of said second group of said memory transistors are changed so as to be programmed to data different from said erased data.

12. A nonvolatile semiconductor memory as recited in claim 11, wherein said second pass potential is higher than threshold voltages of said second group of memory transistors programmed to said different data.

13. A method of programming a nonvolatile semiconductor memory including a cell unit having a plurality of series-connected memory transistors, each of said memory transistors having a drain, a source, a floating gate and a control gate, said method comprising the steps of:
selecting one of said memory transistors for programming with a threshold voltage corresponding to an erased data;
applying a first pass potential to control gates of adjacent memory transistors coupled to said drain and said source of said selected memory transistor;
applying a second pass potential to control gates of remaining memory transistors other than said selected and said adjacent memory transistors; and
applying a programming potential higher than said first pass potential to said control gate of said selected memory transistor.

14. A method as recited in claim 13, wherein said step of selecting said one of said memory transistors is performed after an erasure of said one of said memory transistors.

15. A method of programming a selected one of series-connected memory transistors within a cell unit in a nonvolatile semiconductor memory after an erasure of said selected memory transistor, said method comprising the steps of:

rendering nonconductive first and second adjacent memory transistors coupled to a drain and a source of said selected memory transistor; and charging said drain and said source of said selected memory transistor to a local boost potential by providing a programming potential to a control gate of said selected memory transistor, such that said selected memory transistor maintains an erased data without substantial variation of a threshold voltage corresponding to said erased data.

16. A method of programming a selected one of series-connected memory transistors within a cell unit in a non-volatile semiconductor memory after an erasure of said selected memory transistor, each of said memory transistors having a drain, a source, a floating gate and a control gate, said method comprising the steps of:

providing a programming potential to said control gate of said selected memory transistor;

providing a first pass potential to said control gate of a first memory transistor adjacent to said selected memory transistor and coupled between a bit line and said selected memory transistor; and providing a second pass potential lower than said programming potential to control gates of memory transistors coupled between said first memory transistor and said bit line, said first pass potential being lower than said second potential, said selected memory transistor maintaining an erased data after said erasure without substantial variation of a threshold voltage corresponding to said erased data.

17. A method as recited in claim 16, wherein said step of providing said programming potential is delayed at least until performing said step of providing said first and second pass potentials.

18. A method as recited in claim 17, further comprising the steps of:

providing said first pass potential to said control gate of a second memory transistor adjacent to said selected memory transistor and coupled between a common source line and said selected memory transistor.

19. A method as recited in claim 17, further comprising the steps of:

providing a potential lower than said first pass potential to said control gate of a second memory transistor adjacent to said selected memory transistor and coupled between a common source line and said selected memory transistor.

20. A method as recited in claim 17, wherein said steps of providing said first and second pass potentials include boosting said potentials for a predetermined time duration.

* * * * *